United States Patent [19]

Chamberlain

[11] Patent Number: 4,517,659

[45] Date of Patent: May 14, 1985

[54] CONSTANT-DISTANCE STRUCTURE POLYCELLULAR VERY LARGE SCALE INTEGRATED CIRCUIT

[75] Inventor: John T. Chamberlain, Macclesfield, England

[73] Assignee: Burroughs Corporation, Detroit, Mich.

[21] Appl. No.: 447,832

[22] Filed: Dec. 8, 1982

[30] Foreign Application Priority Data

Dec. 8, 1981 [GB] United Kingdom ............... 8137017

[51] Int. Cl.³ .................. G06F 13/00; G11C 5/06; H01L 27/10; H01L 27/15
[52] U.S. Cl. ........................... 364/900; 365/72; 357/45; 340/825.86; 382/41
[58] Field of Search ... 364/200 MS File, 900 MS File; 382/41; 340/825.79, 825.86; 365/72; 357/45

[56] References Cited

U.S. PATENT DOCUMENTS

| | | | |
|---|---|---|---|
| 3,106,698 | 10/1963 | Unger | 382/41 |
| 3,794,983 | 2/1974 | Sahin | 382/28 |
| 4,060,713 | 11/1977 | Golay | 382/41 |
| 4,065,808 | 12/1977 | Schemberg et al. | 364/200 |
| 4,192,004 | 3/1980 | Buerger | 364/518 |
| 4,215,401 | 7/1980 | Holsztynski et al. | 364/200 |

Primary Examiner—Raulfe B. Zache
Assistant Examiner—Thomas Lee
Attorney, Agent, or Firm—Mark T. Starr; Edmund M. Chung; K. R. Peterson

[57] ABSTRACT

A very large scale integrated circuit, covering the entire surface of a semiconductor wafer, comprises a plurality of data processing cells and a port. Starting at the port, cells can be made to couple to neighboring cells which are then tested and incorporated into the overall working of the integrated circuit if functional to grow a functional array of interconnected cells on the wafer.

Each cell is square and comprises a data processing element, four coupling sections and four link sections. The link sections allow the cell either to communicate with one of its four neighbors or to internally circulate data. The coupling sections join the link sections. The data processing element is associated with one of the link sections. The cells are divided into two groups, a first group with its cells all having the element associated with the coupling section in one corner and a second group with its cells all having the element associated with the coupling section in the opposite corner. Cells of the two groups are disposed in alternate diagonal rows and display the property that the electrical distance between successive data processing elements is constant regardless of the manner or order of cell incorporation.

7 Claims, 7 Drawing Figures

CONSTANT-DISTANCE STRUCTURE POLYCELLULAR VERY LARGE SCALE INTEGRATED CIRCUIT

BACKGROUND TO THE INVENTION

1. Field of the Invention

The present invention relates to very large scale integrated circuits comprising a plurality of selectably interconnectable data processing cells, where the cells are incorporated into the overall working of the integrated circuit dependently upon their having passed a test of their functionality. In particular, the present invention relates to such a circuit disposed over the surface of a semiconductor wafer substrate.

2. The Prior Art

It is known to form an integrated circuit over the entire surface of a semiconductor wafer substrate up to several inches in diameter, the circuit consisting in a plurality of cells in a tessellation across the wafer face. Each cell is selectably operable to receive and provide data coupling to one or more of its neighboring cells. Starting at a port, coupling is provided to a first cell or cells from the outside world. The first cell or cells are tested and coupling to the port is confirmed if the test is passed. Thereafter, the cells which have just passed the test are operable to couple to an as yet untested neighboring cell for it to be tested. If the new neighbors pass the test they too are incorporated into the operation of the circuit and in turn couple to other untested neighbors for the other neighbors to be tested. In this way cells are progressively tested across the surface of the wafer, incorporated into the overall operation of the circuit if they are found to be working and rejected and bypassed if they are found not to work. The inherent failure rate in the fabrication of the individual cells when making such a wafer is thereby helped by weeding out those that cannot operate.

Various methods exist for selecting which neighboring cells are to be tested.

In a first method, each cell has a direction counter. The direction counters in all of the cells are synchronized and moved by a globally-provided clock signal to all move together. Any cell which has previously been tested resists further testing. Each cell, as it is tested and, if passing the test, becomes incorporated, is enabled to couple to neighboring cells to initiate their testing. All incorporated cells attempt to couple in the current test direction to any neighbor which will accept the approach. The simultaneous coupling and testing from all incorporated cells results in a rapidly-growing branched-labyrinth of cells forming across the surface of the wafer.

In a second method each cell, once tested and incorporated, resists further testing and, as before, is enabled to couple to an untested neighbor for that neigbor to be tested. The cell does not comprise a direction counter and is commanded from outside which neighbor it is to couple to. Only one cell at a time is tested on the whole wafer. A spiral of cells is formed from the port wherein each cell is coupled to from just one neighbor and provides further coupling to just one other neighbor.

In a third method, a spiral of cells is grown similarly to the second method, with the exception that, whereas in the second method, when a cell is found which has no neighbor which passes the test or which will accept a coupling approach, indicating that the growing tip of the spiral has found the end of a blind cul-de-sac, the growth retreats back down the cul-de-sac dis-incorporating each cell in turn until a cell is found having a neighbor from which growth can continue and leaving behind a non-incorporated body of known working cells in the cul-de-sac. In the third method, cells are not dis-incorporated in the retreat from a cul-de-sac and the cell which is eventually found having an incorporable neighbor is allowed to couple out both to the new neighbor from which growth will continue and to the cul-de-sac, the third method producing a branched-spiral of intercoupled cells across the surface of the wafer.

The three methods described provide only a representative sample of the numerous methods available.

The manner of coupling between cells is simplified if the data is allowed to circulate in a closed path within each cell unless that cell is coupled to from a neighbor, in which case, data which would otherwise have been circulated within the cell is passed to the neighbor across the appropriate boundary and data which would otherwise have circulated within the neighbor is passed across the same boundary to the cell. When the overall circuit is configured, a data processing loop is formed starting at and returning to the port. At each stage of growth the operation of cells can be checked by data being passed in at the port and compared with the data returning back from the loop to the port. The sequence of instructions required for testing is simplified and the amount of hardware in each cell is minimized.

It has been the practice to arrange that cells are rectangular or square each having four boundary-sharing neighbors and four data processing elements in each cell for processing data either passed round the cell or received from a neighbor, the processed data either being passed further round the cell to another data processing element in the cell or across the boundary to another neighbor.

Cells should be kept small in order to maximize the proportion of cells which are found to be working subsequently to the manufacture of the wafer. If the cells are kept small then the size of each data processing element is unacceptably reduced, whereas if the size of the cells is increased to make the data processing elements each acceptably large, then the percentage yield of working cells becomes too low.

It is sometimes important to have a foreknowledge of the delay between data processing elements. In those cases where the data processing elements in the cells do more than the simple storing or retrieval of data, for example, when the data processing elements in a plurality of cells collectively form a digital processor or similarly complicated apparatus, the parts of the apparatus being spaced among many cells, it becomes very important to be able to control and/or predict the delays encountered in the transfer of data between cells.

Accordingly it is desirable to provide an integrated circuit wherein the individual data processing elements are large enough for convenient use without any accompanying sacrifice of percentage working yield of operational cells in the integrated circuit. It is also desirable that the cells in the circuit are interconnectable according to a large variety of methods. It is yet further a desirable feature that the delay time for data passing between data processing elements is a predicatable quantity,

SUMMARY OF THE INVENTION

One is hereinafter defined, for the purposes of describing the invention, as that number next higher than four by the space of one integer and four is defined as that number next lower than one by the space of one integer.

According to a first aspect, the present invention consists in a data processing cell for use in conjunction with a plurality of cells in a wafer-scale integrated circuit, each cell being characterized by having first, second, third and fourth neighboring cells sharing respectively first, second, third and fourth boundaries therewith in respective first, second, third and fourth unidirectionally rotationally displaced directions, first second, third and fourth data links respectively associated with said first, second, third and fourth boundaries, and a single data processing element, each of said links being selectably operable in a first mode to receive data from that link next higher in number and operable in a second mode to couple data received from that link next lower in number across said associated boundary and to receive data from across said associated boundary for coupling to that link next higher in number, said single data processing element being coupled intermediately between a first one of said links and that link next higher in number than said first one of said links.

According to a second aspect, the present invention consists in an integrated circuit comprising a plurality of data processing cells, characterized by each one of said cells having first, second, third and fourth neighboring cells sharing respectively first, second, third and fourth boundaries therewith in first, second, third and fourth respective unidirectionally rotationally displaced directions, first, second, third and fourth data links associated respectively with said first, second, third and fourth boundaries, and a data processing element, each of said links being selectably operable in a first mode to receive data from that link next lower in number and to provide data to that link next higher in number, and operable in a second mode to couple data received from that link next lower in number across said associated boundary and to receive data from across said associated boundary for coupling to said link next higher in number, said integrated circuit being further characterized by said plurality of cells consisting in two types of cells, a first type wherein said data processing element is coupled intermediately between said first link and said second link and a second type wherein said data processing element is coupled intermediately between said third link and said fourth link, said first and second types of cells being contiguously disposed such that no cell of said first type abuts onto another cell of said first type and no cell of said second type abuts onto another cell of said second type.

BRIEF DESCRIPTION OF THE PREFERRED EMBODIMENT

In a preferred embodiment, a circular wafer has a plurality of cells fabricated thereon together with a port. The cells are preferably rectangular or square and preferably form a tessellation across the surface of the wafer such that each square cell has four neighbors with which it shares a boundary.

Each cell preferably has a link section associated with each of its four boundaries thereby having four link sections. Each cell preferably comprises four internal coupling sections. The internal coupling sections preferably couple the link sections together. If the four boundaries of each cell are designated respectively North, South, East and West and the link sections associated with each of the boundaries similarly designated, then a first coupling section preferably couples the North link section to the East link section, a second coupling section preferably couples the East link section to the South link section, a third coupling section preferably couples the South link section to the West link section, and a fourth coupling section preferably couples the South link section to the East link section. The cell preferably comprises a single data processing element. The data processing element is preferably a memory device. The data processing element is preferably in association with just one of the coupling sections.

Each of the link sections is preferably selectably operable such that, in a first mode, it can receive data from that coupling section joining it to that link section next around counter-clockwise and provide data to the coupling section joining it with the link section next around clockwise, and in a second mode it can receive data from the coupling section next around counter-clockwise, couple the data across its associated boundary, and receive data from across said associated boundary to provide it to the coupling section joining it to the link section next around in a clockwise direction.

The data processing element preferably receives its data and instructions via the coupling section with which it is associated. It preferably provides return data and instructions to said same coupling section with which it is in association.

The isolated cells on the wafer are preferably interconnectable as a result of having passed a functional test to form an array of cells, the interconnections taking place by means of the link sections across the boundaries coupling to one another, in which case coupling between link sections across cell boundaries is achieved by mutual use of the second mode of operation of the link sections.

The cells are preferably dividable into two groups. In a first group the data processing element is preferably associated with that coupling section which occupies a first corner of the cell and in a second group the data processing element is preferably associated with that coupling section which occupies the opposite corner of the cell to that occupied by the coupling section with which the data processing element is in association in the first type of cell. In the first type of cell the data processing element is preferably associated with the coupling section joining the West link section to the North link section in which case, in the second type of cell the data processing element is preferably associated with the coupling section joining the East link section to the South link section.

The first and second types of cells are preferably disposed on the wafer such that diagonal rows of the first type of cell alternate with diagonal rows of the second type of cell, thereby providing that no cell of the first type shares a common boundary with any other cell of the first type and no cell of the second type shares a common boundary with any other cell of the second type, and that each cell of each type is completely surrounded on its boundaries by cells of the other type, this arrangement providing that whatever the manner or direction of coupling between adjacent cells, the distance between consecutive data-processing elements is always three coupling sections.

When configured, the array of cells preferably comprises a data path joining all incorporated data processing elements passing from and returning to the port, whereon all data processing elements are equispaced from one another.

BRIEF DESCRIPTION OF THE DRAWINGS

The invention is further explained, by way of an example, by the following description read in conjunction with the appended drawings, in which.

DETAILED DESCRIPTION OF THE PREFERRED EMBODIMENT

Figure 1:
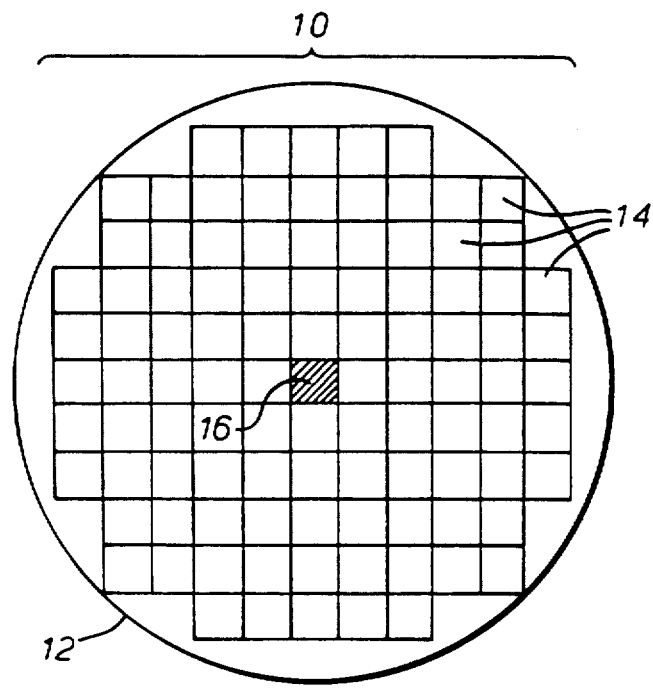
FIG. 1 shows cells on a wafer.

FIG. 1 shows a wafer-scale integrated circuit of a type suitable for the application thereto of the present invention. A wafer-scale integrated circuit 10 comprises a circular, semiconductor wafer 12 whereon are constructed a plurality of data processing cells 14. The cells 14 are square and form a regular tessellation across the surface of the wafer 12 such that each cell 14 shares common boundaries with four other cells 14. One of the cells 14 is omitted from the tessellation to provide a coupling port 16 whereby connection can be made from the outside world to the integrated circuit 10. The port 16 allows for coupling to the cells 14 immediately adjacent thereto for the transfer of data and commands and further allows for the provision of power and any common signals to all of the cells 14 simultaneously.

The port 16 is shown as being central on the wafer 12. It is to be appreciated that the port 16 need not be central on the wafer 12, that there can be more than one port 16, and that the one or more ports 16 can be other than by the omission of a cell 14 from the tessellation. All that is required from the point of view of the present invention is that a method of providing data across one boundary of one cell 14 on the wafer 12 is available.

Figure 2:
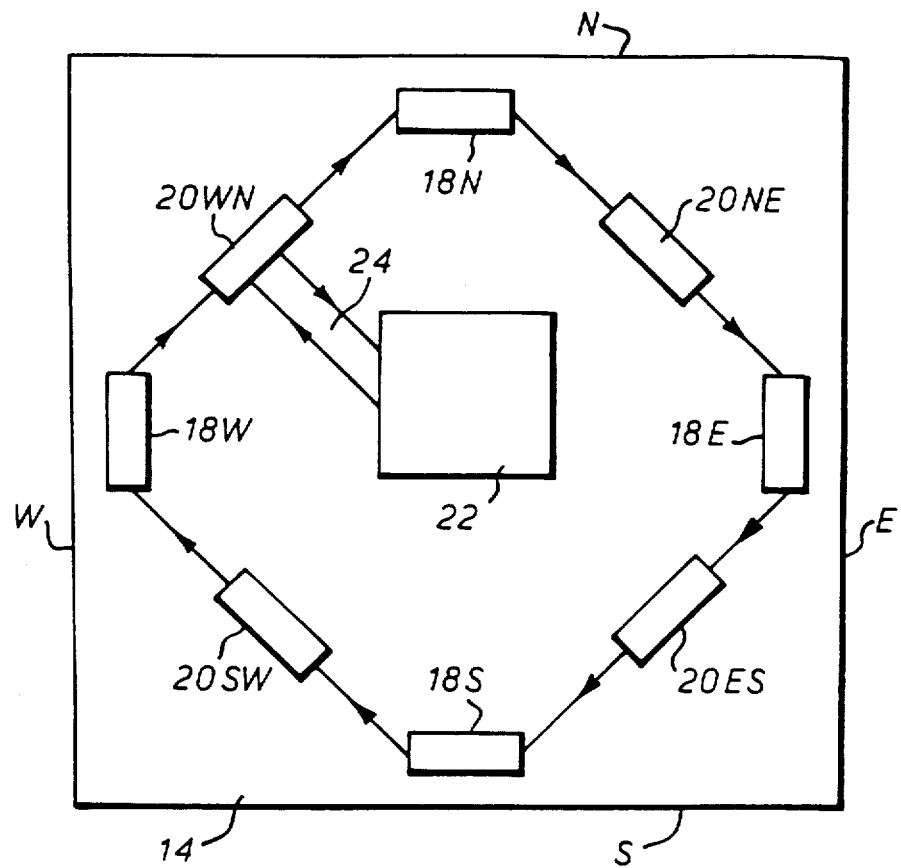
FIG. 2 shows the component parts of an individual cell of the first type.
Figure 3:
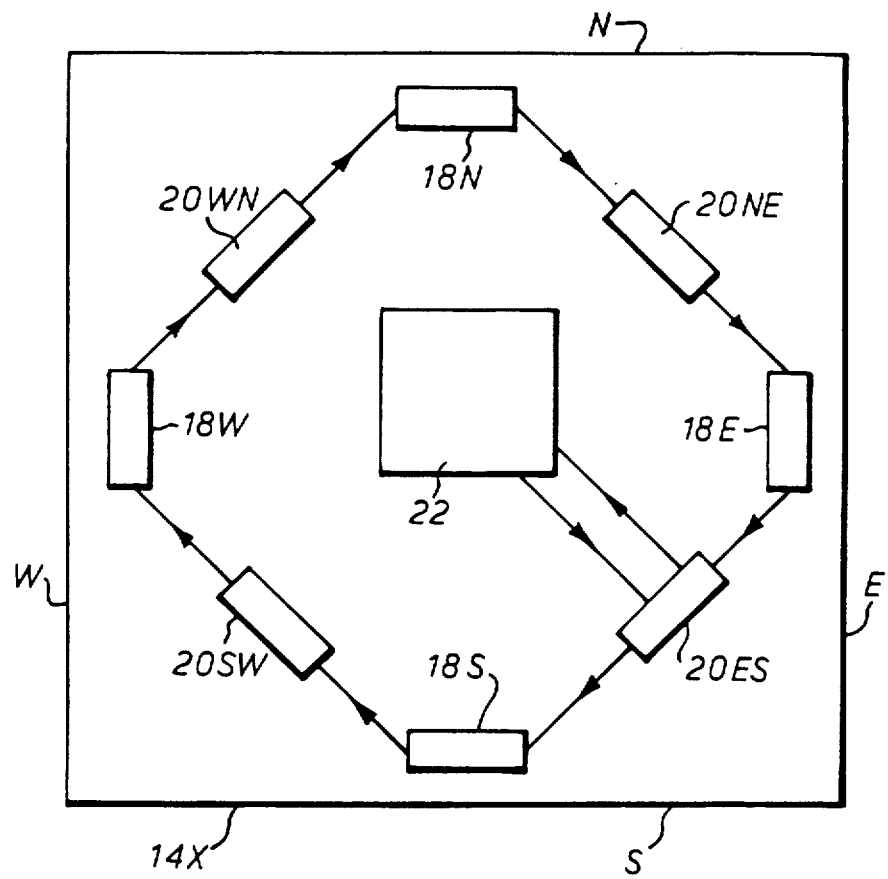
FIG. 3 shows the component parts of an individual cell of the second type.

FIG. 2 shows, in schematic form, the various constituent parts of a cell 14 according to the present invention and of the first of two types.

The cell 14 has a Northern boundary N, a Southern boundary S, an Eastern boundary E and a Western boundary W. Each boundary N, S, E, W has associated therewith a link section 18N, 18S, 18E, 18W respectively, the letter suffix being indicative of the particular boundary N, S, E or W the link section 18 is associated. Unidirectional coupling sections 20NE, 20ES, 20SW and 20WN join the link sections 18N, 18S, 18E and 18W for the flow of data, the first letter of the two letter suffix being indicative of the link section 18 from which data is received and the second letter of the two letter suffix being indicative of the link section 18 to which a coupling section 20 delivers data. Thus the first coupling section 20NE receives data from the Northern link section 18N and provides data to the Eastern link section 18E. The second coupling section 20ES receives data from the Eastern link section 18E and provides data to the Southern link section 18S. The third coupling section 20SW receives data from the Southern link section 18S and provides data to the Western link section 18W. The fourth coupling section 20WN receives data from the Western link section 18W and provides data to the Northern link section 18N. The link sections 18 are each individually and selectably operable to operate in a first mode where they couple data round the cell 14 and in a second mode where they couple data into and out of the cell 14 across their individual boundaries N, S, E, or W.

The cell 14 also comprises a data processing element in the form of a memory module 22. The module 22 is provided with a bidirectional coupling 24 to the fourth coupling section 20WN. The module 22 receives commands with respect to its operation and data for its use via the fourth coupling section 20WN and delivers up to the fourth coupling section 20WN data it has operated on and any commands to be passed on to other modules 22 in other cells 14. The fourth coupling section 20WN then provides the output from the module 22 as the input to the Northern link section 18N.

It is of no real importance to the description of the present invention what the exact nature of the module 22 might be. It can range in sophistication from a simple serial-in serial-out shift register memory to a complete Von Neuman data processor. The manner of its receiving instructions via the fourth coupling section 20WN is also of no importance. The module 22 can be serial or parallel receipt of signals passing through the coupling section 20WN. The module 22 can even be in series with the coupling section 20WN. The module 22 can receive its data down one or more lines and provide its output via one or more lines.

It is also of no real importance what the exact nature of the coupling sections 20NE, 20ES, 20SW and 20WN might be. They can range from a simple direct conductor connection to serial-in serial-out shift registers. All that is required of them is that they deliver what was received at their input to their output at some predictable later time. The three coupling sections 20NE, 20ES and 20SW not associated with the module 22 need to have the same time delay from input receipt to output presentation. It really does not matter about the delay of the coupling section 20WN associated with the module 22. Its delay can be of any acceptable length.

FIG. 2 shows, in schematic outline, the various elements of the second kind of cell according to the present invention.

The second kind of cell 14X is identical in every way with the first kind of cell 14 with the exception that the module 22, instead of being associated with the fourth coupling section 20WN, is associated with the second coupling section 20ES. The exact delay of the second coupling section 20ES then becomes unimportant in the second type of cell 14X provided it is the same as the delay of the fourth coupling section 20WN in the first type of cell 14. In the second type of cell 14X the delays of the remaining three coupling sections 20SW, 20WN and 20NE are the same as one another and the same as the delays in the remaining three coupling sections 20NE, 20ES, and 20SW in the first type of cell 14.

Figure 4A:
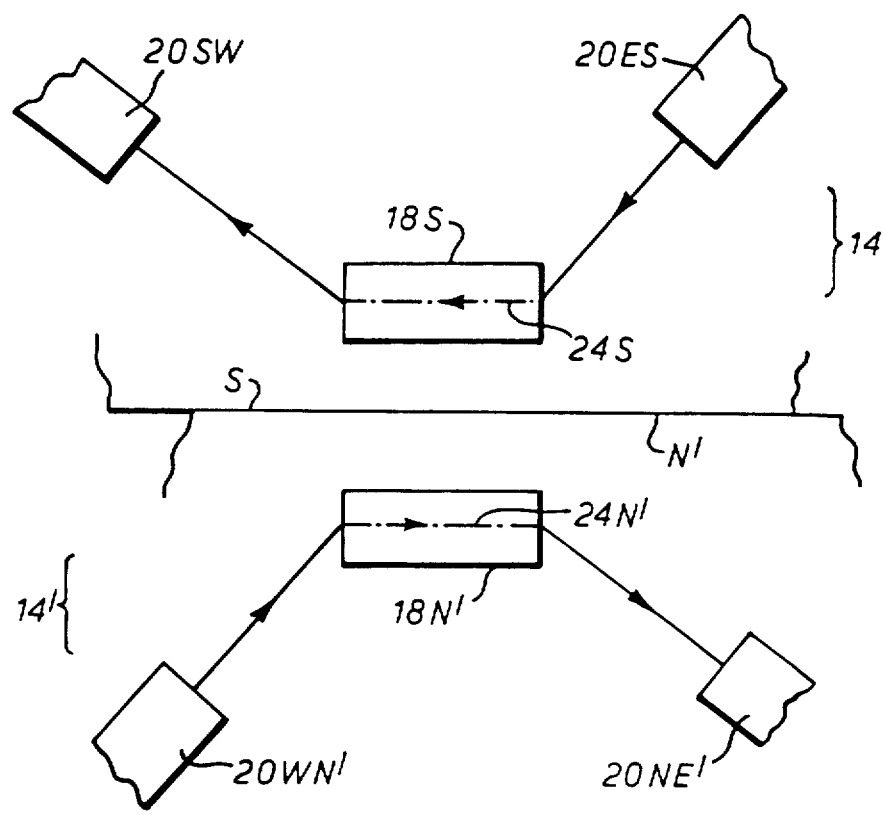
FIG. 4A shows the first manner of coupling of the link sections on opposite sides of a boundary.

FIG. 4A shows the manner of operation of the link sections 18 in adjacent cells across a boundary, and is particularly illustrative of the first mode of operation mentioned above.

The Southern boundary S of a first cell 14 abuts onto the Northern boundary N of a second cell 14', the apostrophe suffix in the designation of an item being indicative of that item belonging to the second cell 14'. The Southern link section 18S of the first cell 14 receives data from the second coupling section 20ES of the first cell 14 and provides data as the input to the third coupling section 20SW of the first cell 14. The Northern link section 18N' of the second cell 14' receives data from the output of the fourth coupling section 20WN' of the second cell 14' and provides data to the input of the first coupling section 20NE' of the second cell 14'. The link sections 18S, 18N' are selectably operable to enter a first mode where each activates an internal through-coupling 24S, 24N' respectively. The output of the second coupling section 20ES of the first cell 14 is thereby routed via the internal through-coupling 24S in the Southern link section 18S of the first cell 14 to become the input to the third coupling section 20SW of the first cell 14 and the output of the fourth coupling section 20WN' of the second cell 14' is thereby routed via the internal through-coupling 24N' in the Northern link section 18N' of the second cell 14' to become the input to the first coupling section 20NE' of the second cell 14'. In this first mode of operation no data is transferred across the boundary S, N' between the link sections 18S, 18N'.

Figure 4B:
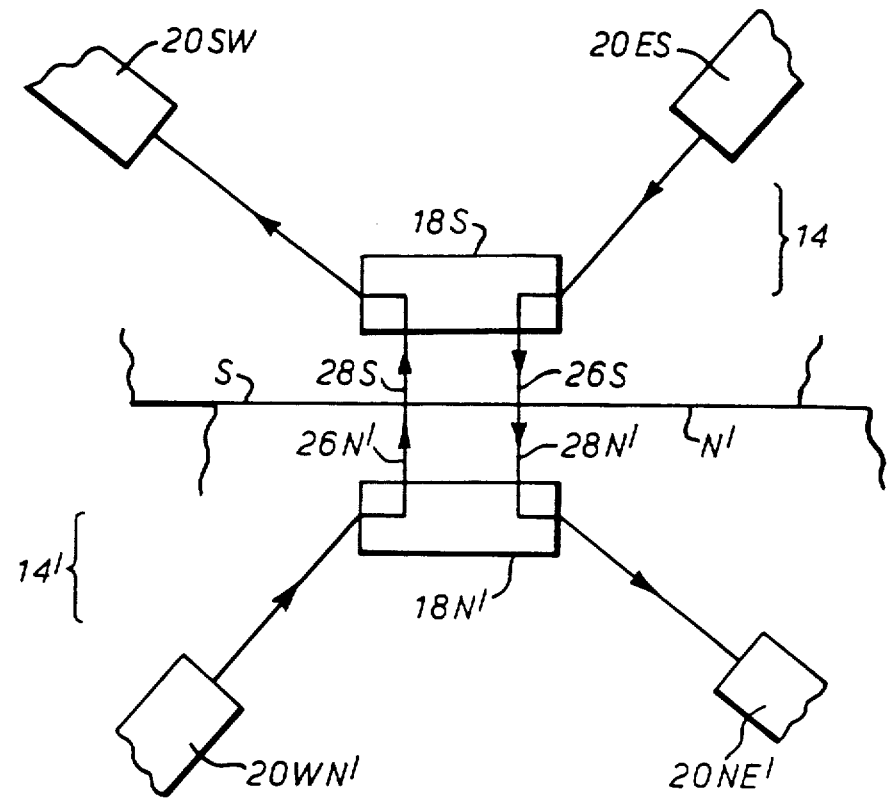
FIG. 4B shows the second manner of coupling of the link sections on opposite sides of a boundary.

FIG. 4B shows the manner of operation of the link sections 18 in adjacent cells 14 and is particularly illustrative of the second mode of operation of the link sections 18 as mentioned above.

When the Southern link section 18S of the first cell 14 and the Northern link section 18N' of the second cell 14' are both placed into a second mode of operation they co-operate to transfer data across the boundary S, N'. The Southern link section 18S of the first cell 14 provides the output of the second coupling section 20ES of the first cell 14 onto a Southern data output line 26S. The Northern link section 18N' of the second cell 14' provides the output of the fourth coupling section 20WN' of the second cell 14' as the signal on a Northern data output line 26N' of the second cell 14'. The Southern link section 18S of the first cell 14 accepts data from a Southern data input line 28S and couples it as the input to the third coupling section 20SW of the first cell 14. The Northern link section 18N' of the second cell 14' accepts the signal from a Northern data input line 28N' and couples it as the input to the first coupling section 20NE' of the second cell 14'. In crossing the boundary S, N' the Southern data output line 26S of the first cell 14 becomes the Northern data input line 28N' of the second cell 14' and the Northern data output line 26N' of the second cell 14' becomes the Southern data input line 28S of the first cell. In the above manner, the two link sections 18S, 18N' co-operate to provide the output of the second coupling section 20ES of the first cell 14 as the input to the first coupling section 20NE' of the second cell 14' and to provide the output of the fourth coupling section 20WN' of the second cell 14' as the input to the third coupling section 20SW of the first cell 14.

It is to be appreciated that, whereas the above description specifies the coupling between the Southern S boundary of a first cell 14 and the Northern boundary of a second cell 14', the coupling between any first boundary in a cell 14 and any other, antipodal boundary in an adjacent cell 14 is just the same, only the suffixes and, where appropriate, numerical designations, in the above description requiring to be altered to provide a complete description of the operations between any pair of boundaries on adjacent cells 14.

It is also to be appreciated that it is immaterial to the foregoing description of the manner of operation of the link sections 18 whether those link sections 18 be in a cell of the first type 14 or a cell of the second type 14X, the manner of operation being exactly the same in both cases.

The manner of causing the link sections 18 to enter a first or second manner of operation, as described above, is not part of the present invention. Those skilled in the art will be aware of many methods of transferring instructions from an external controller, or from cell 14 to cell 14 across the wafer 12. Those skilled in the art will also be aware of various routines to be followed in deciding which cell 14 is to be coupled to which other cell to provide the optimum array of cells 14 on the integrated circuit 10, and of various other hardware items required to be incorporated into each cell 14 to support each routine. None of these forms part of the present invention. It is sufficient for the present invention that instructions for the link sections 18 to be in the first or second modes can be issued and, where co-operation across a boundary is required, that the link sections 18 on both sides of the boundary can be placed simultaneously into the second mode of operation.

U.S. Pat No. 4,471,483 issued 9/11/1984, describes the design and use of link section and coupling section used in the present invention, and how instruction may be transferred to each cell from a controller. U.S. Pat. No. 4,489,397 issued 12/18/84, teaches how a signal may be linked across a boundary and how instruction may be sent to a cell causing it to link to an adjacent cell.

Figure 5:
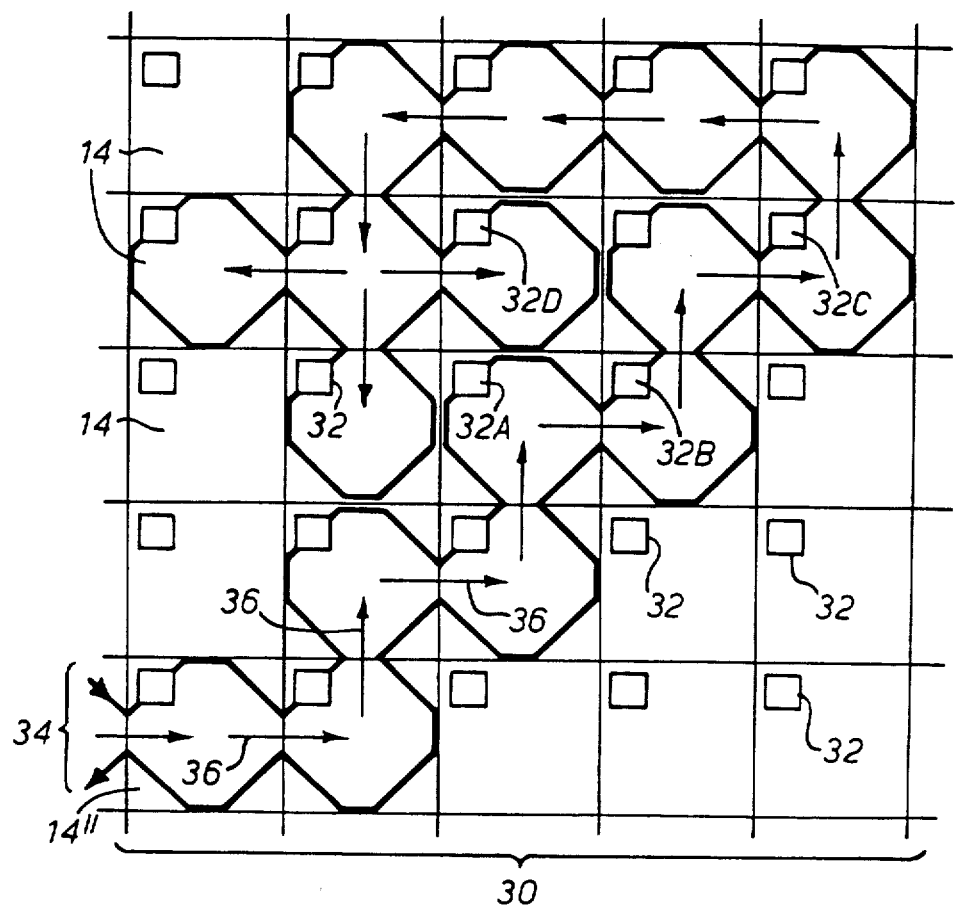
FIG. 5 shows how coupling between cells would be achieved in an array of cells where, contrary to the present invention, there is only one type of cell in the array of cells.

FIG. 5 shows how coupling would be achieved in an array of cells 14 where there is only one kind of cell 14, the coupling therefore not being according to the present invention.

A portion 30 of the total number of cells 14 on the wafer 12 is shown. In this example all of the cells 14 are of the first type as illustrated in FIG. 2. The Module 22 is therefore associated with the fourth coupling section 20WN. This association is symbolized by the module symbol 32 shown in the North-Western corner of each cell 14. The coupling sections 20 are illustrated by a data path 34 shown in solid line which passes round all incorporated cells 14 once unidirectionally, crossing the boundary between cells 14 wherever two adjacent link sections 18 co-operate to produce inter-cell coupling, and starting and finishing at a start cell 14"; which might be adjacent to the port 16 or might just be any cell 14 at any stage in the growth of an array of cells 14 on the wafer 12.

The cells 14 which have been individually accessed from neighboring cells 14 and tested according to any convenient method, are incorporated into the array of cells 14 if they pass the test. The arrows 36 are illustrative of one possible order for their having been accessed, tested and incorporated, showing the approach made from neighboring cells 14.

As can be seen, since the array consists purely in cells of one type, in this case of the first type, the number of coupling sections 20 and link sections 18 encountered between successive modules 32 in the data path 34 is not constant. For example, the distance between a first exemplary module 32A and a second exemplary module 32B, ignoring the particular coupling sections 20WN with which they are associated, is two link sections 18 and one coupling section 20, whereas the distance between a third exemplary module 32C and a fourth exemplary module 32D, once more ignoring the coupling section 20WN with which they are associated, is eight link sections 18 and seven coupling sections 20. This difference in distance can be taken to extremes and it is indeed possible to traverse the entire width of the wafer 12 on the data path 34 without encountering a module 32.

Figure 6:
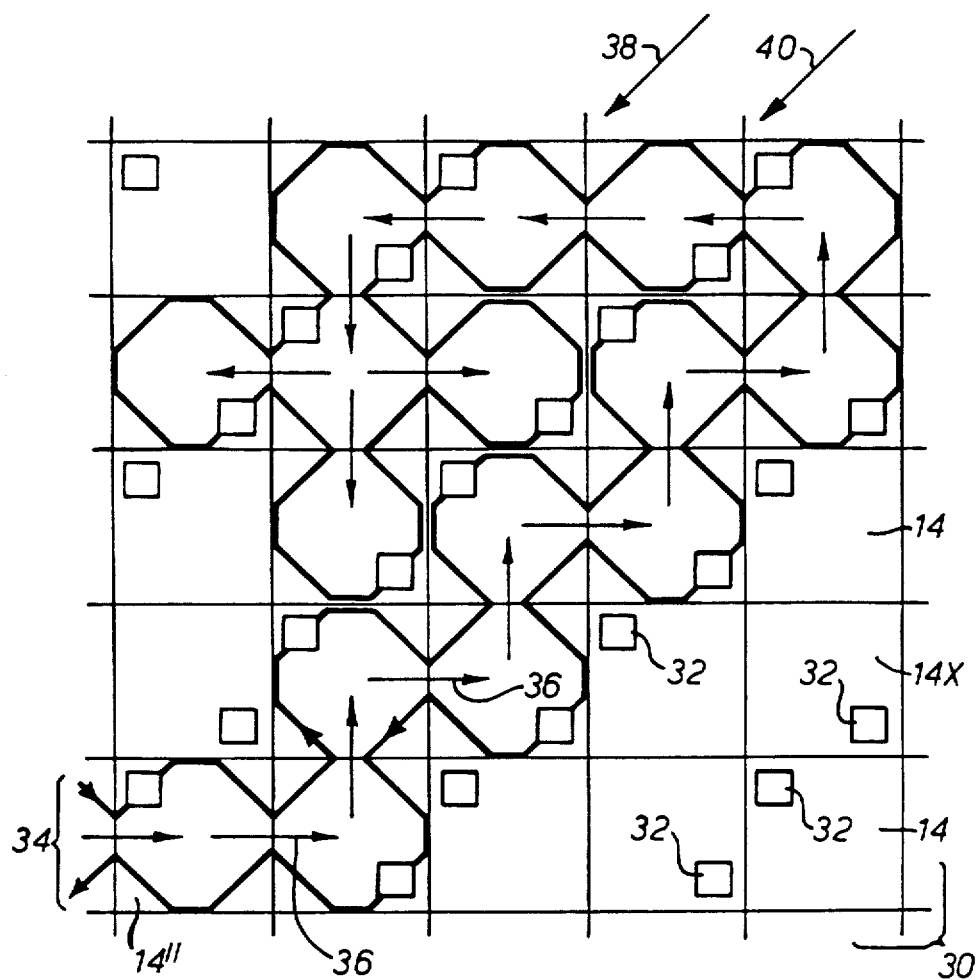
FIG. 6 shows the disposition of the first and second types of cells on the wafer to achieve the configuration of the present invention.

FIG. 6 shows how coupling is achieved in an integrated circuit 10 comprising cells 14 of both the first type 14 and second type 14X and therefore being in accordance with the present invention.

The same portion 30 of the cells 14 on the wafer 12 as was shown in FIG. 5 is shown in FIG. 6. Everything is the same in FIG. 6 as in FIG. 5, with the exception that the portion 30 of the body of cells 14 in FIG. 6 consists in cells of the first type 14 and cells of the second type 14X. The cells of the first type 14 and the cells of the second type 14X are alternated across the surface of the integrated circuit 10. The first fletched arrow 38 points along a diagonal row of cells of the first type 14 where the module 32 is associated with the fourth coupling section 20WN. The second fletched arrow 40 points along a diagonal row of cells of the second type 14X where the module 32 is associated with the second coupling section 20ES. The cells of the first type 14 alternate with the cells of the second type 14X in the same way that the black and white squares alternate on a chess board, alternate diagonal rows being of the first and second types of cells 14, 14X. Thus no cell of the first type 14 shares a boundary N, S, E or W with any other cell of the first type 14, being entirely surrounded on its boundaries N, S, E, W by cells of the second type 14X. Similarly, no cell of the second type 14X shares a common boundary N, S, E or W with any other cell of the second type 14X, being entirely surrounded on its boundaries N, S, E and W by cells of the first type 14.

Examination of the distance between consecutive modules 32 in the loop data path 34 of FIG. 6 reveals that, ignoring the coupling section (20WN for cells of the first type 14 and 20ES for cells of the second type 14X) the distance is everywhere four link sections 18 and three coupling sections 20, regardlessly of the manner of intercoupling of the cells 14, 14X. The exemplary manner of coupling shown in FIG. 6 is the same as that shown in FIG. 5, but it would make no difference what the manner of coupling had been. The constant distance property subsists in the geometry of the alternating cells 14, 14X. The constant distance structure shown is therefore suitable for use with any inter-cell coupling algorithm.

It is to be appreciated that, whereas a cell of the first type 14 and a cell of the second type 14X have herebefore been described as being a pair having their respective memory modules 22 (32) associated with the fourth coupling section 20WN and the second coupling section 20ES respectively, the present invention would work equally well if the cells of the first and second types 14, 14X were changed over and if the cells of the first and second types 14, 14X had their memory modules 22 associated instead with the first coupling section 20NE and third coupling section 20SW.

It is not strictly necessary that the cells 14, 14X form an exact tessellation across the wafer 12. It is sufficient that each cell 14, 14X, where possible, has four neighbors with whom it can couple, the cells 14 then being any shape. Those skilled in the art will appreciate that there are topological equivalents to the present invention as described where the manner and distances of coupling between electrically adjacent cells is the same as in the above description without the existence of a corresponding physical adjacense or distance.

It is to be appreciated that, whereas the flow of data has been depicted in the foregoing description as being unidirectional along the coupling sections 20 and link sections 18, it has been so described illustratively of the manner of operation of the invention. The depicted unidirectional data flow can be taken as representative of a bidirectionality of flow not only of data but also of instructions and other signals suitable and necessary for the operation of the numerous acceptable kinds of data processing elements 22 employable in the cells 14, 14A.

What I claim is:

1. An integrated circuit comprising an array of a plurality of data processing cells, each of said cells comprising:

first, second, third and fourth boundaries shared with first, second, third and fourth neighboring cells respectively in unidirectionally sequentially numbered by unit increment and sequentially rotationally displaced first, second, third and fourth respective directions, first, second, third and fourth data links associated respectively with said first, second, third and fourth boundaries, and each selectively operable in a first mode to receive data from that link next lower in number and to provide data to that link next higher in number and is selectively operable in a second mode to couple data received from said link next lower in number across said associated boundary and to receive data from across said associated boundary for coupling to said link next higher in number, a single data processing element coupled intermediately between a first one of said links and that link next higher in number than said first one of said links, a first coupling section coupled to transfer said data between said first data link and said second data link, a second coupling section coupled to transfer said data between said second data link and said third data link, a third coupling section coupled to transfer said data between said third data link and said fourth data link, and a fourth coupling section coupled to transfer said data between said fourth data link and said first data link, where said array comprises two types of cells;

a first type of cell wherein said data processing element is associated with said first coupling section and a second type of cell wherein said data processing element is associated with said third coupling section, and where said first and second types of cells are arranged alternately on said integrated circuit such that no cell of said first type can transfer data to another cell of said first type and no cell of said second type can transfer data to another cell of said second type, each cell in said array being coupled to receive a command and being operable to respond thereto to transfer data between itself and a selected neighboring cell by a communicating cell having the link adjacent to said selected neighboring cell selected to operate in said second mode to communicate with the selected neighboring cell and by the link in the selected neighboring cell adjacent to said communicating cell also being selected to operate in said second mode, whereby the path between any one pair of sequential data processing elements in any chain grown in said array is of the same length as any other path between any other pair of sequential data processing elements in the chain.

2. An integrated circuit according to claim 1 wherein:
each of said cells is square, and
said cells are arranged in a regular tessellation such that said first, second, third and fourth neighboring cells are the only cells with which said each one of said cells shares a boundary.

3. An integrated circuit according to claim 2 wherein:
if said each one of said cells is a cell of said first type then said first, second, third and fourth neighboring cells are cells of said second type, and wherein if said each one of said cells is a cell of said second type then said first, second, third and fourth neighboring cells are cells of said first type.

4. An integrated circuit according to claim 3 wherein:
in said first type of cell the delay imparted to through-passing data by said second, third and fourth coupling sections in each case is equal to a first predetermined value, and wherein
in said second type of cell the delay imparted to through-passing data by said first, second and fourth coupling sections in each case is equal to said first predetermined value.

5. An integrated circuit according to claim 4 wherein:
in said first type of cell the delay imparted to through-passing data by said first coupling section is equal to a second predetermined value, and wherein
in said second type of cell the delay imparted to through-passing data by said third coupling section is equal to said second predetermined value.

6. An integrated circuit according to claim 5 wherein said array of cell is provided on a common semiconductor substrate, said common substrate forming at least part of the area of a semiconductor wafer.

7. An integrated circuit according to claim 6 comprising
a port for the provision of data therethrough to at least a first cell in said array, said port being formed by the omission from said tessellation of a cell.

* * * * *